United States Patent
Hung et al.

(10) Patent No.: US 9,455,227 B1
(45) Date of Patent: Sep. 27, 2016

(54) SEMICONDUCTOR DEVICE AND METHOD FOR FABRICATING THE SAME

(71) Applicant: UNITED MICROELECTRONICS CORP., Hsin-Chu (TW)

(72) Inventors: Ching-Wen Hung, Tainan (TW); Jia-Rong Wu, Kaohsiung (TW); Yi-Hui Lee, Taipei (TW); Ying-Cheng Liu, Tainan (TW); Chih-Sen Huang, Tainan (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/935,456

(22) Filed: Nov. 9, 2015

(30) Foreign Application Priority Data

Oct. 7, 2015 (TW) .............................. 104132992 A

(51) Int. Cl.
*H01L 29/94* (2006.01)
*H01L 23/535* (2006.01)
*H01L 29/66* (2006.01)
*H01L 21/768* (2006.01)
*H01L 21/28* (2006.01)
*H01L 29/06* (2006.01)
*H01L 29/78* (2006.01)

(52) U.S. Cl.
CPC ....... *H01L 23/535* (2013.01); *H01L 21/28088* (2013.01); *H01L 21/76889* (2013.01); *H01L 21/76895* (2013.01); *H01L 29/0653* (2013.01); *H01L 29/66545* (2013.01); *H01L 29/66795* (2013.01); *H01L 29/7851* (2013.01)

(58) Field of Classification Search
CPC ............. H01L 23/535; H01L 29/0653; H01L 29/66545; H01L 29/66795; H01L 29/7851; H01L 21/28088; H01L 21/76889; H01L 21/76895
USPC .................................. 257/384, 401; 438/286
See application file for complete search history.

(56) References Cited

U.S. PATENT DOCUMENTS

| 8,791,528 | B2 | 7/2014 | Lin et al. | |
| 2012/0273848 | A1* | 11/2012 | Fan ................... | H01L 21/82341 257/288 |
| 2016/0043075 | A1* | 2/2016 | Lavoie .................. | H01L 27/088 257/365 |
| 2016/0064327 | A1* | 3/2016 | Lin ....................... | H01L 23/535 257/368 |

OTHER PUBLICATIONS

Lin, Title of Inventon: Semiconductor Device and a Fabrication Method Thereof, U.S. Appl. No. 14/855,357, filed Sep. 15, 2015.

* cited by examiner

*Primary Examiner* — Tu-Tu Ho
(74) *Attorney, Agent, or Firm* — Winston Hsu; Scott Margo

(57) ABSTRACT

A method for fabricating semiconductor device is disclosed. The method includes the steps of: providing a substrate; forming a first gate structure on the substrate; forming a first contact plug adjacent to the first gate structure; and performing a replacement metal gate (RMG) process to transform the first gate structure into metal gate.

7 Claims, 7 Drawing Sheets

US 9,455,227 B1

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of forming contact plug before conducting a replacement metal gate (RMG) process.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the FinFET can be controlled by adjusting the work function of the gate.

As the semiconductor industry enters 10 nm node generation, the contact area of contact plugs largely decreases and results in resistance increase. The quantity of masks used during contact plug formation also increases substantially, creating larger shift in resistance particularly in the active region and affecting the performance of the device. Hence, how to effectively resolve this issue has become an important task in this field.

SUMMARY OF THE INVENTION

According to a preferred embodiment of the present invention, a method for fabricating semiconductor device is disclosed. The method includes the steps of: providing a substrate; forming a first gate structure on the substrate; forming a first contact plug adjacent to the first gate structure; and performing a replacement metal gate (RMG) process to transform the first gate structure into metal gate.

According to another aspect of the present invention, a semiconductor device is disclosed. The semiconductor device includes: a substrate having a fin-shaped structure thereon; a first gate structure on the fin-shaped structure; a first contact plug adjacent to the first gate structure; and a first hard mask on the first contact plug.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
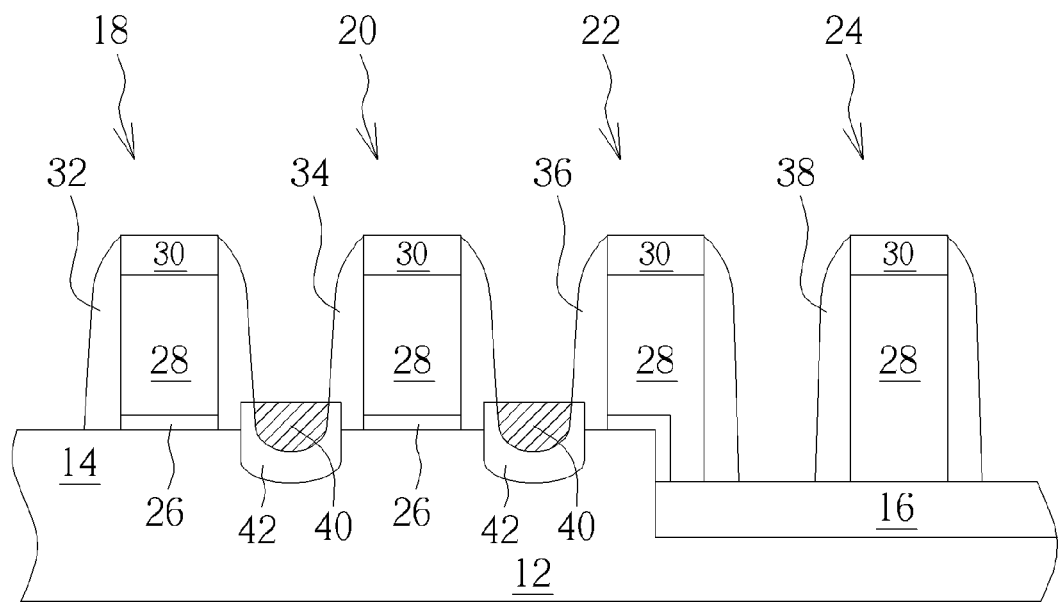
FIGS. 1-13 illustrate a method for fabricating semiconductor device according to a preferred embodiment of the present invention.

Referring to FIGS. 1-13, FIGS. 1-13 illustrate a method for fabricating semiconductor device according to a preferred embodiment of the present invention. As shown in FIG. 1, a substrate 12, such as a silicon substrate or silicon-on-insulator (SOI) substrate is provided. At least a fin-shaped and an insulating layer (not shown) are formed on the substrate 12, in which the bottom of the fin-shapes structure 14 is preferably enclosed by the insulating layer, such as silicon oxide to form a shallow trench isolation (STI) 16. A plurality of gate structures 16 and 18 are formed on part of the fin-shaped structure 14, a gate structure 24 is formed on the STI 16, and a gate structure 22 is formed on the fin-shaped structure 14 and STI 16 at the same time.

The formation of the fin-shaped structure 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form a STI surrounding the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the STI could be eliminated.

The fabrication of the gate structures 18, 20, 22, 24 could be accomplished by a gate first process, a high-k first approach from gate last process, or a high-k last approach from gate last process. Since this embodiment pertains to a high-k last approach, gate structures 18, 20, 22, 24 composed of interfacial layer 26, polysilicon material 28, and hard mask 30 could be first formed on the fin-shaped structure 14 and STI 16, and spacers 32, 34, 36, 38 are formed on the sidewalls of the gate structures 18, 20, 22, 24. A source/drain region 40 and/or epitaxial layer 42 are then formed in the fin-shaped structure 14 and/or substrate 12 adjacent to two sides of the spacer 34.

Figure 2:
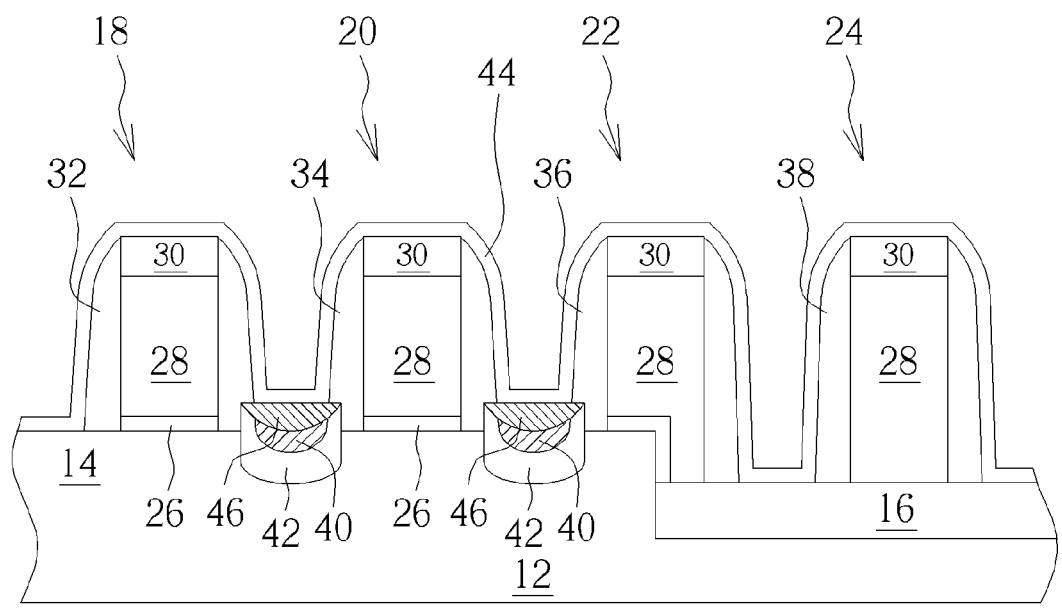

Next, as shown in FIG. 2, a metal layer 44 is formed on the gate structures 18, 20, 22, 24 to cover the epitaxial layer 42 and STI 16 surface, in which the metal layer 44 is selected from the group consisting of Ti, Ta, TiN, and TaN, but not limited thereto. Next, a cap layer (not shown) composed of TiN could be selectively formed on the metal layer 44, and a rapid thermal process is carried out to react the metal layer 44 with silicon within the epitaxial layer 42 for forming a silicide layer 46. It should be noted that since all of the metal layer 44 contacting the epitaxial layer 42 is preferably transformed into silicide layer 46 during the rapid thermal process, the remaining metal layer 44, such as the un-reacted metal from the silicide process would still remain on the surfaces of the spacers 32, 34, 36, 38, hard mask 30, and silicide layer 46.

Figure 3:
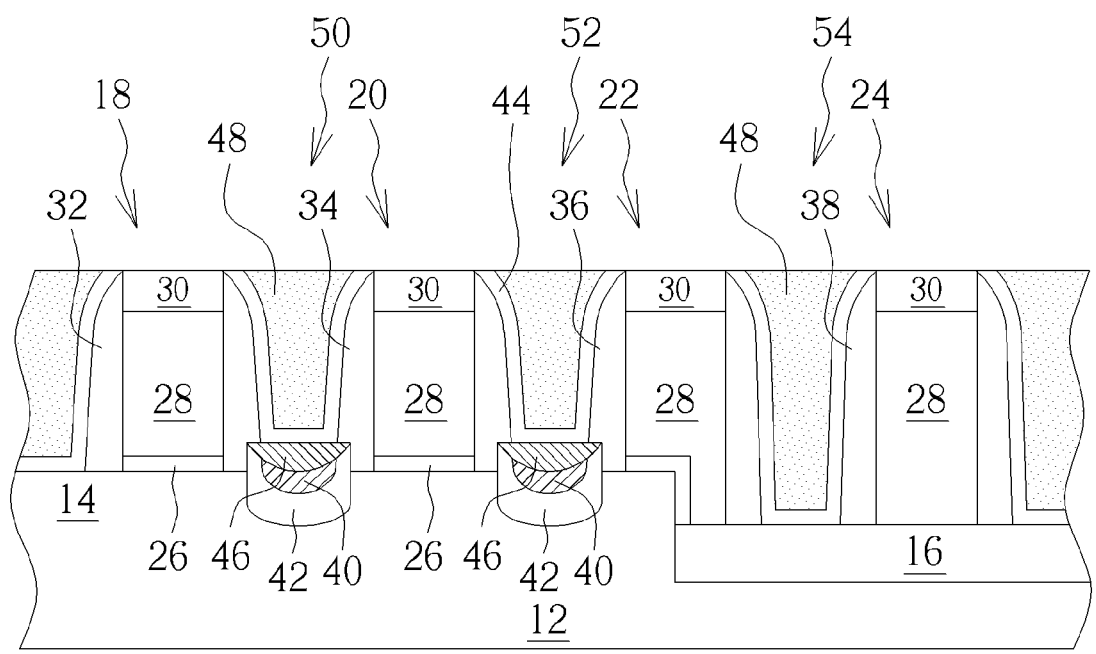

Next, as shown in FIG. 3, a metal layer 48 is formed on the metal layer 44 and filled into the gaps between the gate structures 18, 20, 22, 24, in which the metal layer 48 is preferably selected from the group consisting of Al, Ti, Ta, W, Nb, Mo, and Cu, but not limited thereto. Next, a planarizing process, such as CMP process is conducted to remove part of the metal layer 48 and metal layer 44 to form contact plugs 50, 52 and contact plug 54. Preferably, the top surfaces of the contact plugs 50, 52, 54 and the hard masks 30 are coplanar, in which the contact plugs 50 and 52 are disposed on the fin-shaped structure 14 while the contact plug 54 is disposed on the STI 16.

Figure 4:
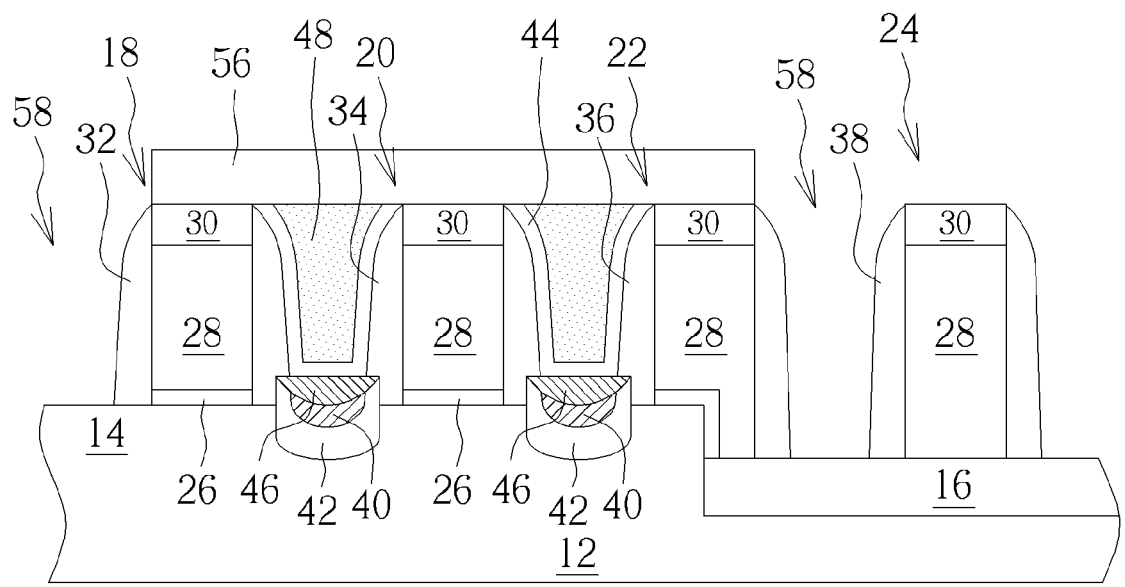

Next, as shown in FIG. 4, a hard mask 56 is formed on the gate structures 18, 20, 22 and contact plugs 50 and 52, and an etching process is conducted by using the hard mask 56 as mask to remove the contact plugs not covered by the hard mask 56, such as all of the contact plug 54 on the STI 16. This forms a recess 58 exposing the STI 16 surface and the sidewalls of the spacers 36 and 38. In this embodiment, the hard mask 56 is preferably composed of oxides, such as $SiO_2$ and SiON.

Figure 5:
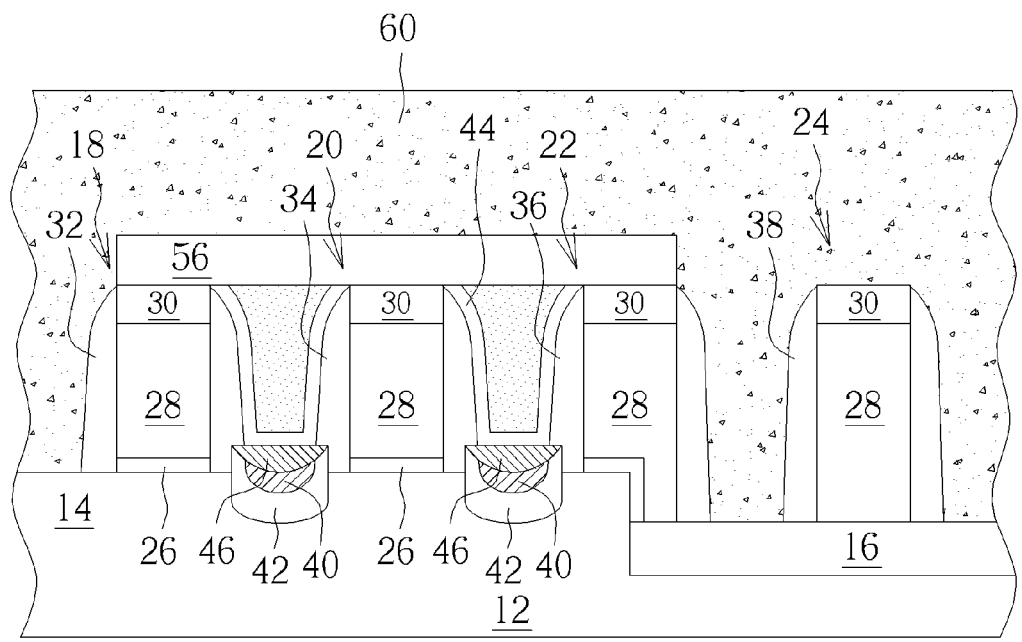

Next, as shown in FIG. 5, a flowable chemical vapor deposition (FCVD) process is conducted to deposit an interlayer dielectric (ILD) layer 60 on the gate structures 18, 20, 22, 24, hard mask 56, and STI 16 and filling the recess 58, in which the ILD layer 60 could be composed of oxides or other dielectric material, such as tetraethyl orthosilicate (TEOS), but not limited thereto.

Figure 6:
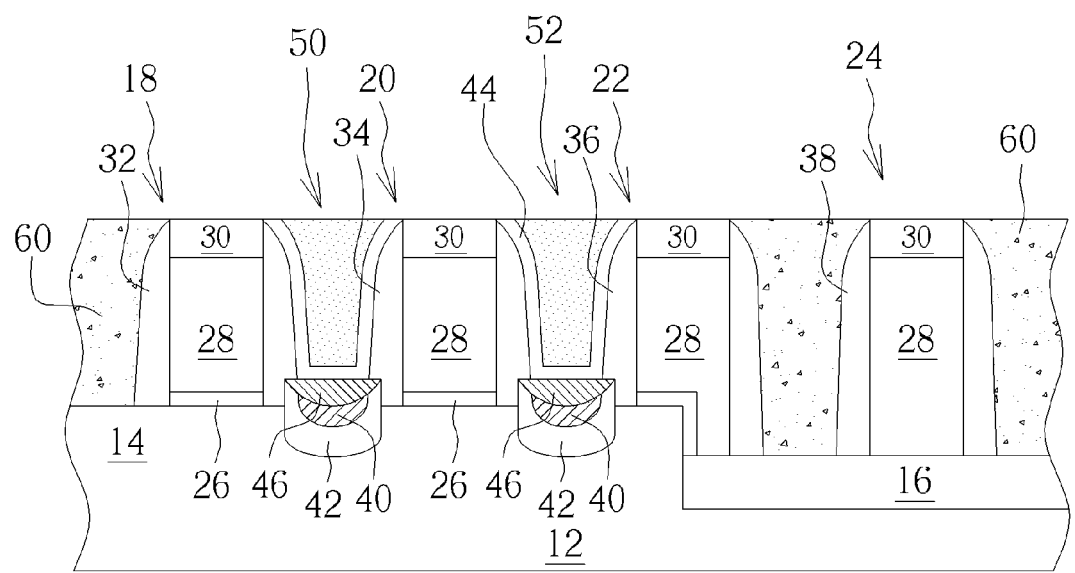

It should be noted that since the hard mask 56 and ILD layer 60 are composed of oxides in this embodiment, as shown in FIG. 6, a planarizing process, such as a CMP process could be conducted to remove part of the ILD layer 60 and all of the hard mask 56 to expose the surface of the contact plugs 50 and 52 so that the surface of the remaining ILD layer 60 is even with the surface of the contact plugs 50 and 52.

Figure 7:
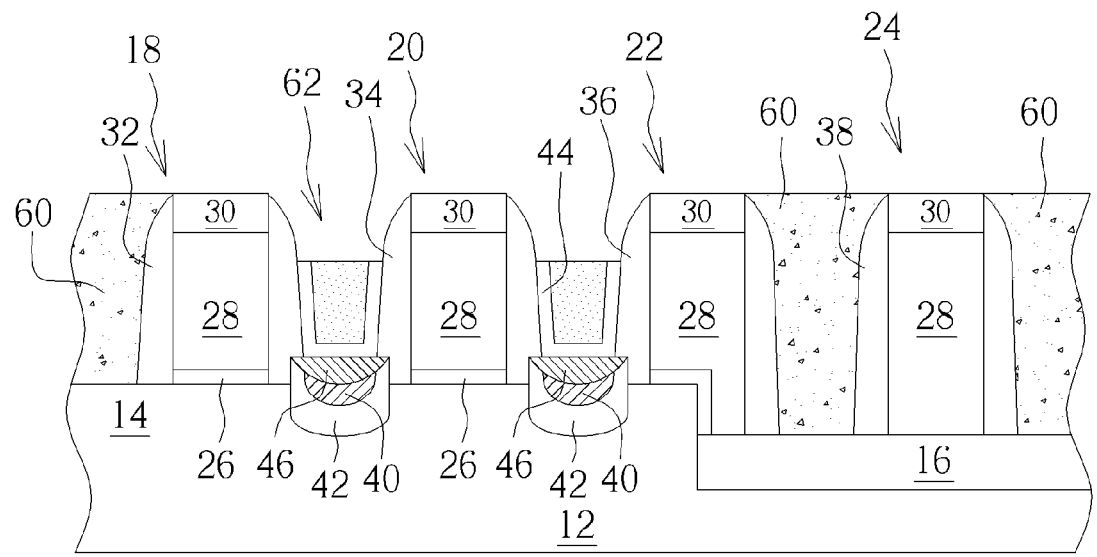

Next, as shown in FIG. 7, an etching process is conducted by using the gate structures 18, 20, 22, 24 and ILD layer 60 as mask to remove part of the contact plugs 50 and 52 so that the top surface of the remaining contact plugs 50 and 52 is slightly lower than the top surface of the polysilicon material 28 of the gate structures 18 and 20. This forms recesses 62 on the remaining contact plugs 50 and 52 and between the gate structures 18, 20, 22.

Figure 8:
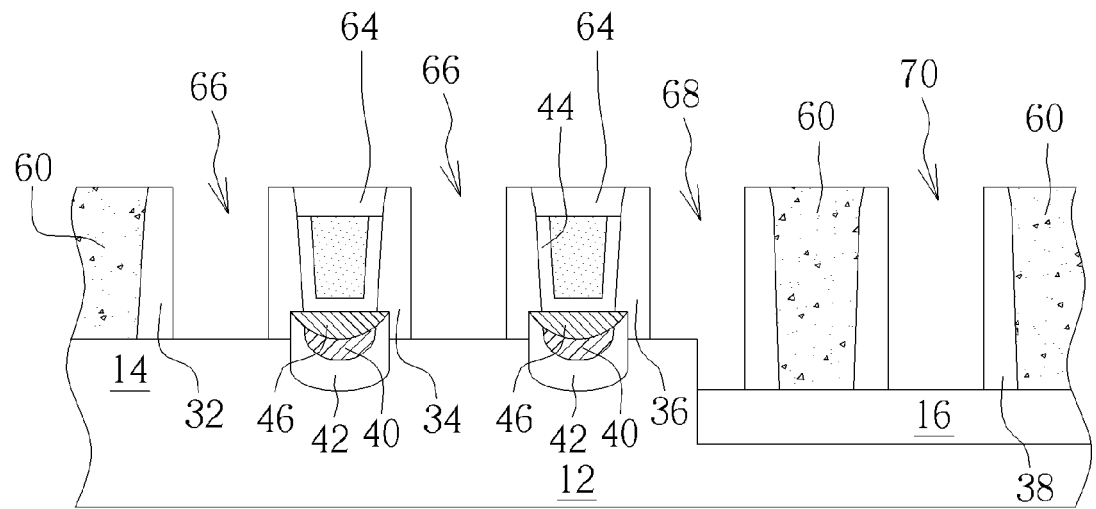

Next, as shown in FIG. 8, a mask layer (not shown) is formed on the gate structures 18, 20, 22, 24 and ILD layer 60 to fill the recesses 62, and a planarizing process, such as CMP is conducted to remove part of the mask layer, part of the spacers 32, 34, 36, 38, part of ILD layer 60, and all of the hard masks 30. This forms hard masks 64 on the remaining contact plugs 50 and 52, in which the top surface of the hard masks 64 is even with the top surface of the polysilicon material 28 of the gate structures 18, 20, 22, 24. In this embodiment, the hard masks 64 are preferably composed of oxides such as silicon dioxide, but not limited thereto.

Figure 9:
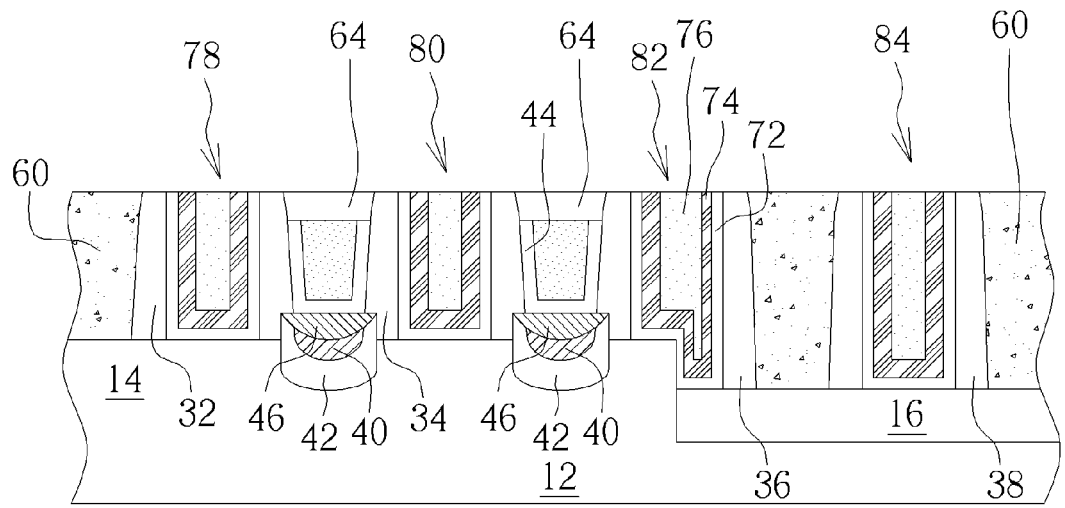

Next, a replacement metal gate (RMG) process is conducted by using the hard masks 64 and ILD layer 60 as mask to remove all of the polysilicon material 28 and interfacial layer 26 within the gate structures 18, 20, 22, 24 through etching process for forming recesses 66, 68, 70 on the fin-shaped structure 14 and STI 16. Next, as shown in FIG. 9, a high-k dielectric layer 72, a work function metal layer 74, and a low resistance metal layer 76 are deposited into the recesses 66, 68, 70.

The high-k dielectric layer 72 is preferably selected from dielectric materials having dielectric constant (k value) larger than 4. For instance, the high-k dielectric layer 26 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 74 is formed for tuning the work function of the later formed metal gates to be appropriate in an NMOS or a PMOS. For an NMOS transistor, the work function metal layer 74 having a work function ranging between 3.9 eV and 4.3 eV may include titanium aluminide (TiAl), zirconium aluminide (ZrAl), tungstenaluminide (WAl), tantalum aluminide (TaAl), hafnium aluminide (HfAl), or titanium aluminum carbide (TiAlC), but it is not limited thereto. For a PMOS transistor, the work function metal layer 74 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 74 and the low resistance metal layer 76, in which the material of the barrier layer may include titanium (Ti), titanium nitride (TiN), tantalum (Ta) or tantalum nitride (TaN). Furthermore, the material of the low resistance metal layer 76 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Next, a planarizing process, such as CMP process is conducted to remove part of the low resistance metal layer 76, part of the work function metal layer 74, and part of the high-k dielectric layer 72 to form metal gates 78, 80, 82, 84. Preferably, the metal gates 78 and 80 are disposed on the fin-shaped structure 14, the metal gate 84 is disposed on the STI 16, and the metal gate 82 is disposed on the fin-shaped structure 14 and STI 16 at the same time, in which the top surfaces of the metal gates 78, 80, 82, 84, and hard masks 64 are coplanar.

Figure 10:
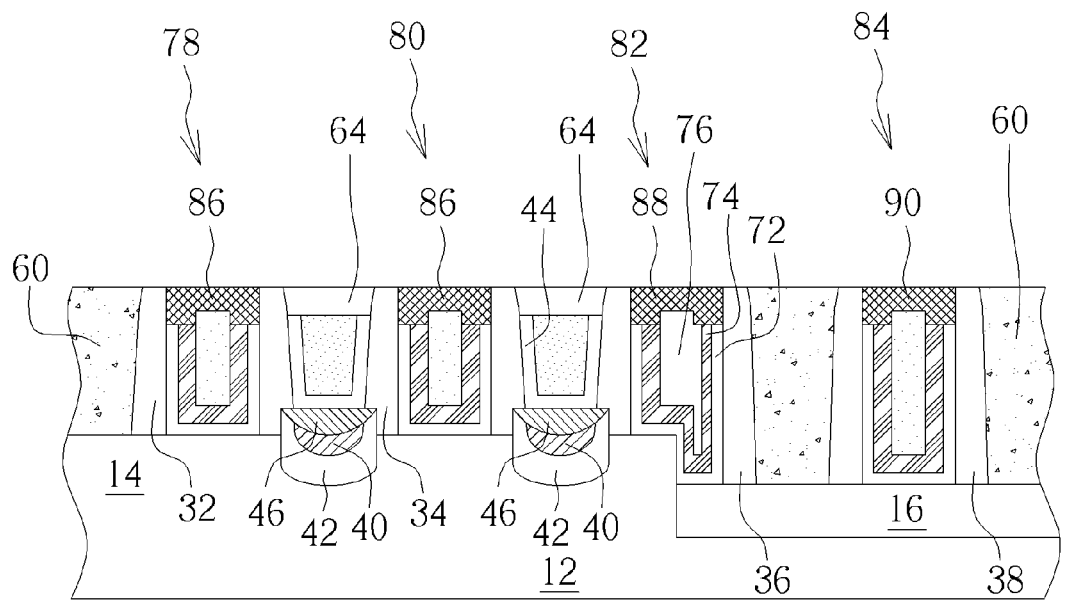

Next, as shown in FIG. 10, an etching process is conducted by using the hard masks 64 and ILD layer 60 as mask to remove part of the metal gates 78, 80, 82, 84 for forming recesses (not shown), a mask layer (not shown) is filled into the recesses, and a planarizing process such as CMP is conducted to remove part of the mask layer to form hard masks 86, 88, 90 on the metal gates 78, 80, 82, 84, in which the top surface of the hard masks 86, 88, 90 is even with the top surface of the hard masks 64 and ILD layer 60. In this embodiment, the material of the hard masks 86, 88, 90 is preferably different from the hard masks 64. For instance, the hard masks 86, 88, 90 is preferably composed of silicon nitride, but not limited thereto.

Figure 11:
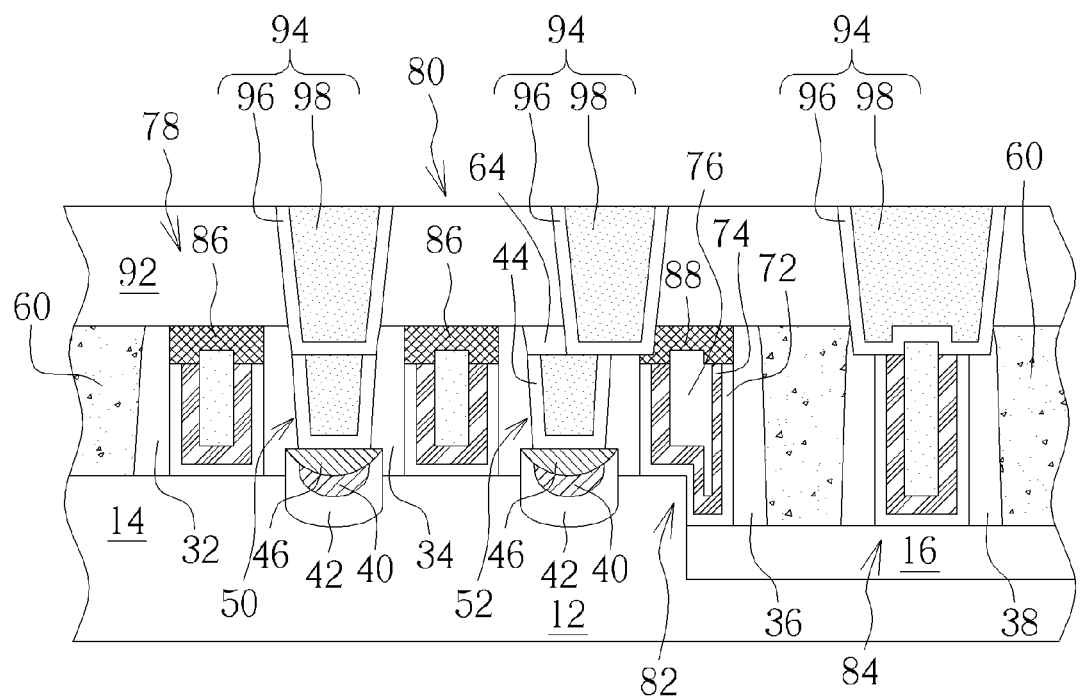

Next, as shown in FIG. 11, a dielectric layer 92 is formed on the hard masks 86, 88, 90, the hard masks 64, and the ILD layer 60, and a contact formation process is conducted to form multiple contact plugs 94 electrically connected and contacting the contact plugs 50 and 52, hard masks 64, and metal gate 84. In this embodiment, each of the contact plugs 94 is composed of a barrier layer 96 and a metal layer 98, in which the barrier layer 96 is preferably selected from the group consisting of Ti, Ta, TiN, TaN, and WN and the metal layer 98 is selected from the group consisting of Al, Ti, Ta, W, Nb, Mo, and Cu.

Figure 12:
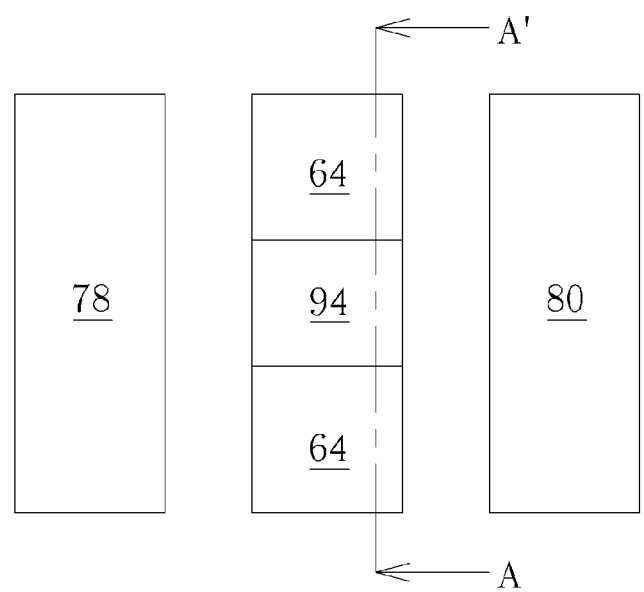
Figure 13:
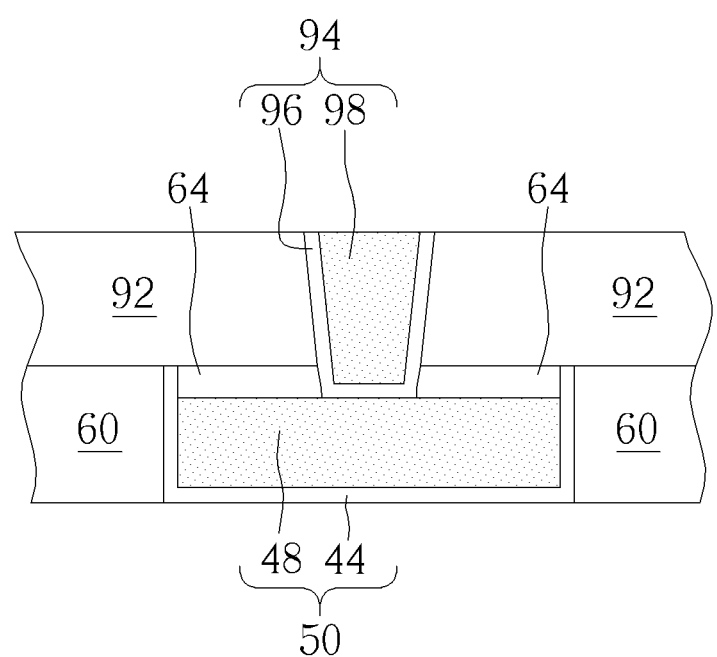

It should be noted that since only part of the hard masks 64 is removed to expose the contact plugs 50 and 52 and metal gate 84 underneath during the formation of contact plugs 94, the contact plugs 94 not only contact the contact plugs 50 and 52 and metal gate 84 but also contact the hard masks 64 at the same time. Referring to FIGS. 12-13, FIG. 12 is a top view illustrating a contact plug 94 between metal gates 78, 80 contacting hard masks 64 and FIG. 13 is a cross-sectional view of FIG. 12 along the sectional line AA'. As shown in FIGS. 12-13, since only part of the hard mask 64 is removed so that the remaining hard mask 64 would be disposed adjacent to two sides of the contact plug 94 while the contact plug 94 is electrically connected to the contact plug 50 underneath, the contact plug 94 would be contacting the contact plug 50 and hard mask 64 simultaneously, or more specifically, the bottom of the contact plug 94 would be contacting the contact plug 50 while the sidewalls of the contact plug 94 would be contacting the remaining hard mask 64. This completes the fabrication of a semiconductor device according to a preferred embodiment of the present invention.

Referring again to FIG. 11, which further discloses a semiconductor device structure according to a preferred embodiment of the present invention. As shown in FIG. 11, the semiconductor device includes at least a fin-shaped structure 14 on the substrate 12, a STI 16 surrounding the fin-shaped structure 14, a plurality of metal gates 78 and 80 on the fin-shaped structure 14, a metal gate 84 on the STI 16, a metal gate 82 on the fin-shaped structure 14 and STI 16 at the same time, a plurality of spacers 32, 34, 36, 38 adjacent to the metal gates 78, 80, 82, 84, a plurality of contact plugs 50, 52 on the fin-shaped structure 14, a hard mask 64 on each of the contact plugs 50, 52, hard masks 86, 88, 90 on the metal gates 78, 80, 82, 84, a ILD layer 60 on the fin-shaped structure 14 and STI 16, a dielectric layer 92 on the metal gates 78, 80, 82, 84, and contact plugs 94 in the dielectric layer 92 and contacting the contact plugs 50, 52 and metal gate 84.

Specifically, the contact plug 50 is preferably disposed between metal gate 78 and metal gate 80 and contacting the spacers 32 and 34 at the same time, or no other elements such as a dielectric layer is present between the spacers 32, 34 and the contact plug 50.

Next, as states previously, since only part of the hard mask 64 is removed to expose the contact plugs 50, 52 and metal gate 84 underneath during the formation of contact plugs 94, the contact plugs 94 would preferably be disposed between the dielectric layer 92 and hard mask 64 at the same time and also contacting the contact plugs 50, 52, metal gate 84, and hard mask 64 at the same time.

In addition, the top surface of the hard masks 86, 88, 90 is even with the top surfaces of the hard mask 64 and ILD layer 60 and the hard mask 64 and hard masks 86, 88, 90 are preferably composed of different material. For instance, the hard mask 64 is composed of silicon oxide while the hard masks 86, 88, 90 are composed of silicon nitride, but not limited thereto. The dielectric layer 92 and hard mask 64 are preferably composed of same material, such as both are composed of oxides, but not limited thereto.

Overall, the present invention preferably forms contact plugs adjacent to the gate structure composed of polysilicon and contacts the contact plugs to the spacers directly before a RMG process is conducted. This increases the contact area for contact plugs substantially and also prevents contact shift problem arise during contact formation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a fin-shaped structure thereon;
   a first gate structure on the fin-shaped structure;
   a first contact plug adjacent to the first gate structure, wherein the first contact plug comprises metal;
   a first hard mask on the first contact plug; and
   a second hard mask on the first gate structure, wherein the top surfaces of the second hard mask and the first hard mask are coplanar.

2. The semiconductor device of claim 1, further comprising:
   a shallow trench isolation (STI) around the fin-shaped structure;
   a second gate structure on the STI;
   a first spacer adjacent to the first gate structure and a second spacer adjacent to the second gate structure; and
   an interlayer dielectric (ILD) layer adjacent to the second gate structure on the STI.

3. The semiconductor device of claim 2, further comprising:
   a third gate structure on the fin-shaped structure; and
   a third spacer adjacent to the third gate structure, wherein the first contact plug contact the first spacer and the third spacer.

4. The semiconductor device of claim 1, wherein the first hard mask and the second hard mask comprise different material.

5. The semiconductor device of claim 1, further comprising:
   a dielectric layer on the first gate structure; and
   a second contact plug in the dielectric layer and the first hard mask and contacting the first contact plug.

6. The semiconductor device of claim 5, wherein the dielectric layer and the first hard mask comprise same material.

7. The semiconductor device of claim 5, wherein the second contact plug contacts the first hard mask directly.

* * * * *